(12) United States Patent
Suzuki et al.

(10) Patent No.: US 8,368,181 B2
(45) Date of Patent: *Feb. 5, 2013

(54) MESA SEMICONDUCTOR DEVICE AND METHOD OF MANUFACTURING THE SAME

(75) Inventors: Akira Suzuki, Ota (JP); Katsuyuki Seki, Ojiya (JP); Keita Odajima, Fukaya (JP)

(73) Assignees: SANYO Semiconductor Co., Ltd., Ora-gun (JP); SANYO Semiconductor Manufacturing Co., Ltd., Ojiya-shi (JP); Semiconductor Components Industries, LLC, Phoenix, AZ (US)

( * ) Notice: Subject to any disclaimer, the term of this patent is extended or adjusted under 35 U.S.C. 154(b) by 190 days.

This patent is subject to a terminal disclaimer.

(21) Appl. No.: 12/338,694

(22) Filed: Dec. 18, 2008

(65) Prior Publication Data

US 2009/0160035 A1    Jun. 25, 2009

(30) Foreign Application Priority Data

Dec. 25, 2007    (JP) ................. 2007-332702

(51) Int. Cl.
*H01L 29/06*    (2006.01)
*H01L 27/082*   (2006.01)
*H01L 27/102*   (2006.01)
*H01L 29/70*    (2006.01)
*H01L 31/11*    (2006.01)

(52) U.S. Cl. ......... 257/623; 257/586; 257/622; 257/624

(58) Field of Classification Search .............. 257/496, 257/586, 618, 623, 624, 625, 626, 622
See application file for complete search history.

(56) References Cited

U.S. PATENT DOCUMENTS 4,040,084 A    8/1977  Tanaka et al.
(Continued)

FOREIGN PATENT DOCUMENTS

JP    62-46534    2/1987
JP     2-44729    2/1990
(Continued)

OTHER PUBLICATIONS

Seki, K. et al., U.S. Office Action mailed on Jul. 26, 2010, directed to U.S. Appl. No. 12/354,620; 6 pages.

(Continued)

*Primary Examiner* — Chuong A. Luu
(74) *Attorney, Agent, or Firm* — Morrison & Foerster LLP (57) ABSTRACT

The invention provides a mesa semiconductor device and a method of manufacturing the same which enhance the yield and productivity. An N− type semiconductor layer is formed on a front surface of a semiconductor substrate, and a P type semiconductor layer is formed thereon. An anode electrode is further formed on the P type semiconductor layer so as to be connected to the P type semiconductor layer, and a mesa groove is formed from the front surface of the P type semiconductor layer deeper than the N− type semiconductor layer so as to surround the anode electrode. Then, a second insulation film is formed from inside the mesa groove onto the P type semiconductor layer on the outside of the mesa groove. The second insulation film is made of an organic insulator such as polyimide type resin or the like. The lamination body made of the semiconductor substrate and the layers laminated thereon is then diced along a scribe line.

11 Claims, 8 Drawing Sheets

U.S. PATENT DOCUMENTS

| | | | |
|---|---|---|---|
| 4,227,975 A | | 10/1980 | Hartman et al. |
| 4,656,497 A | | 4/1987 | Rogers et al. |
| 4,824,797 A | * | 4/1989 | Goth .......................... 438/421 |
| 4,974,050 A | * | 11/1990 | Fuchs .......................... 257/496 |
| 5,313,092 A | | 5/1994 | Tsuruta et al. |
| 5,726,086 A | * | 3/1998 | Wu .............................. 438/253 |
| 5,726,088 A | | 3/1998 | Yanagiya et al. |
| 5,882,986 A | | 3/1999 | Eng et al. |
| 6,127,720 A | * | 10/2000 | Nakura et al. ................ 257/509 |
| 6,521,538 B2 | | 2/2003 | Soga et al. |
| 6,787,848 B2 | | 9/2004 | Ono et al. |
| 6,831,367 B2 | | 12/2004 | Sekine |
| 7,129,112 B2 | | 10/2006 | Matsuo |
| 7,380,915 B2 | | 6/2008 | Terui |
| 7,498,661 B2 | | 3/2009 | Matsuo |
| 7,646,015 B2 | * | 1/2010 | Fujii et al. ....................... 257/40 |
| 7,741,192 B2 | | 6/2010 | Shimoyama et al. |
| 7,776,672 B2 | | 8/2010 | Nakazawa et al. |
| 2003/0116532 A1 | | 6/2003 | Goldbach et al. |
| 2009/0160034 A1 | * | 6/2009 | Suzuki et al. ................ 257/623 |
| 2009/0189257 A1 | | 7/2009 | Seki et al. |

FOREIGN PATENT DOCUMENTS

| | | |
|---|---|---|
| JP | 2002-134523 | 5/2002 |
| JP | 2003-124478 | 4/2003 |
| JP | 2003-347306 | 12/2003 |
| JP | 2004-296488 | 10/2004 |
| JP | 2005-51111 | 2/2005 |
| JP | 2005-276877 | 10/2005 |
| JP | 2006-12889 | 1/2006 |
| JP | 2006-156926 | 6/2006 |
| JP | 2006-287118 | 10/2006 |
| JP | 2006-310672 | 11/2006 |
| JP | 2007-180303 | 7/2007 |
| JP | 2007-207796 | 8/2007 |
| JP | 2007-305906 | 11/2007 |
| JP | 2008-10608 | 1/2008 |
| KR | 1999-003500 | 1/1999 |
| KR | 10-2003-0003089 | 1/2003 |
| TW | 417190 | 1/2001 |
| TW | 200415796 | 8/2004 |
| TW | I237343 | 8/2005 |
| TW | I266367 | 11/2006 |
| TW | I281442 | 5/2007 |
| WO | WO-03/077306 | 9/2003 |

OTHER PUBLICATIONS

Seki, U.S. Office Action mailed Oct. 25, 2010, directed to U.S. Appl. No. 12/354,620; 8 pages.

Suzuki, U.S. Office Action mailed Nov. 30, 2010, directed to U.S. Appl. No. 12/338,686; 7 pages.

Seki, K. et al., U.S. Office Action mailed Jun. 30, 2011, directed to U.S. Appl. No. 12/354,620; 8 pages.

* cited by examiner

MESA SEMICONDUCTOR DEVICE AND METHOD OF MANUFACTURING THE SAME

CROSS-REFERENCE OF THE INVENTION

This application claims priority from Japanese Patent Application No. 2007-332702, the content of which is incorporated herein by reference in its entirety.

BACKGROUND OF THE INVENTION

1. Field of the Invention

The invention relates to a mesa semiconductor device having a mesa groove and a method of manufacturing the same.

2. Description of the Related Art

Figure 12:
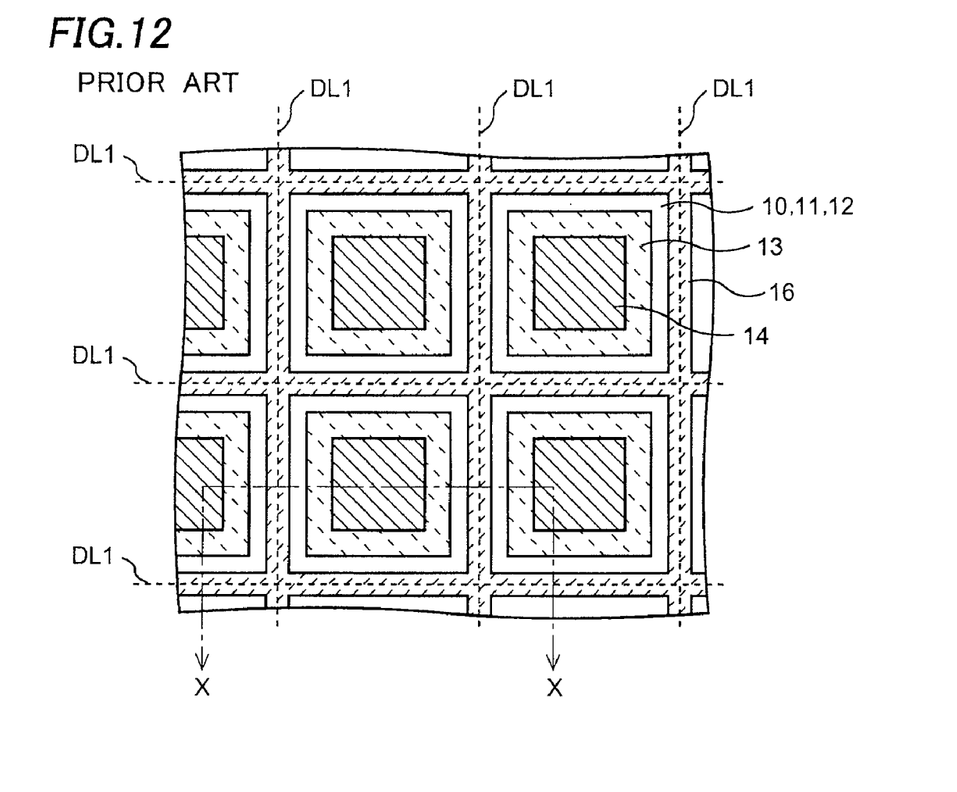
FIG. 12 is a plan view of a conventional mesa diode.
Figure 13:
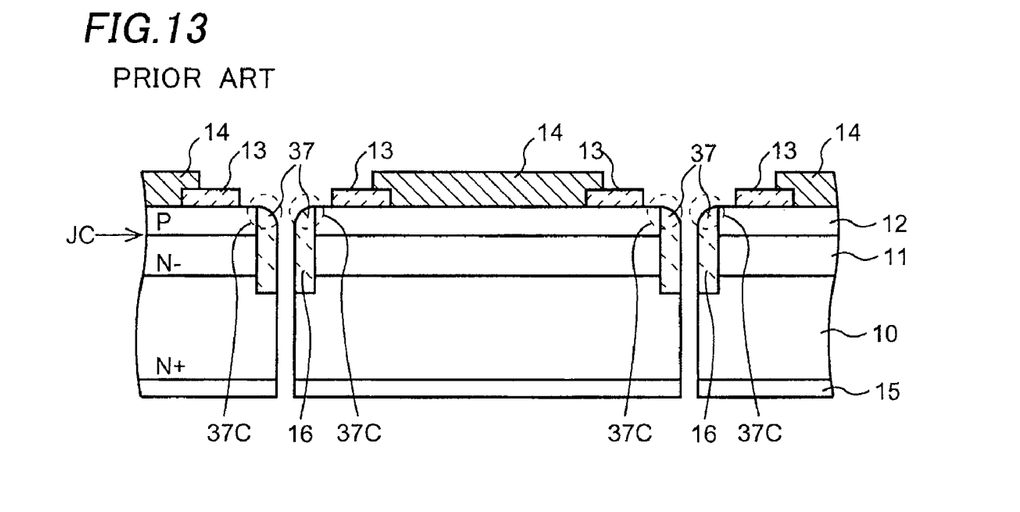
FIG. 13 is a cross-sectional view of the conventional mesa diode.
Figure 14:
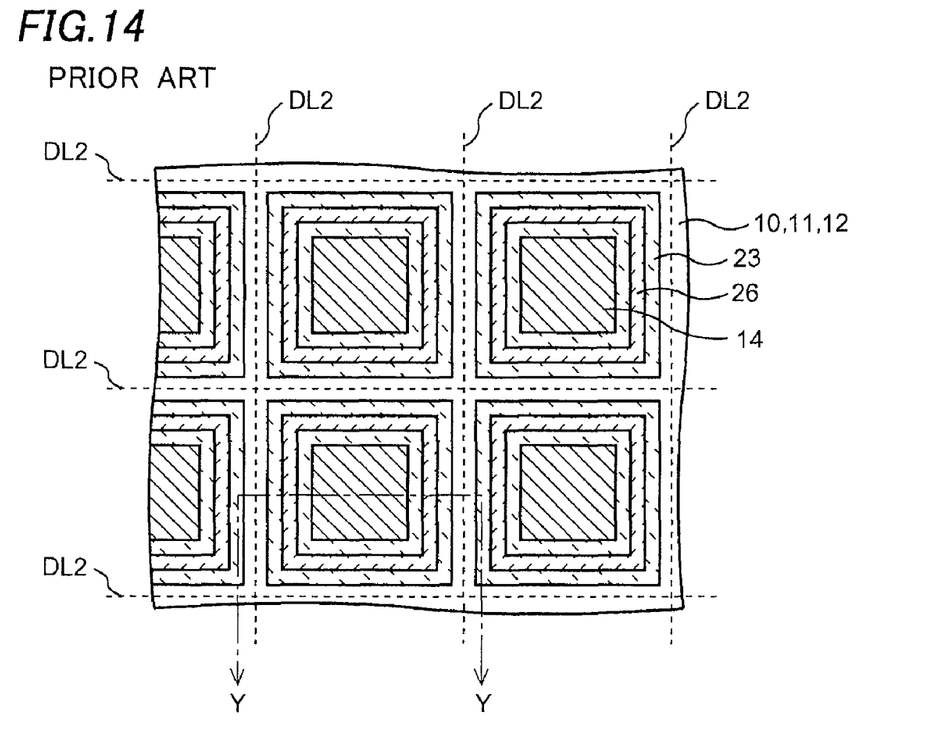
FIG. 14 is a plan view of a conventional mesa diode.
Figure 15:
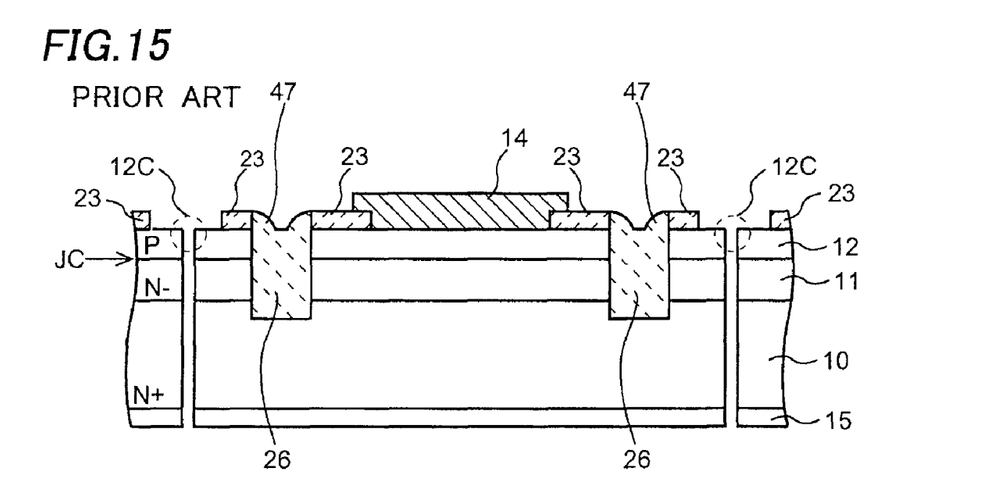
FIG. 15 is a cross-sectional view of the conventional mesa diode.

A high power mesa diode is conventionally known as one of mesa semiconductor devices. A conventional mesa diode will be described referring to FIGS. 12 to 15. FIGS. 12 and 14 are schematic plan views of a semiconductor wafer where a plurality of conventional mesa diodes is disposed in a matrix. FIG. 13 is a cross-sectional view of FIG. 12 along line X-X, showing a state after dicing along a scribe line DL1. FIG. 15 is a cross-sectional view of FIG. 14 along line Y-Y, showing a state after dicing along a scribe line DL2.

As shown in FIGS. 12 and 13, an N-type semiconductor layer 11 is formed on a front surface of an N+ type semiconductor substrate 10. A P type semiconductor layer 12 is formed on the front surface of the N-type semiconductor layer 11, and a first insulation film 13 is formed on the P type semiconductor layer 12. An anode electrode 14 electrically connected to the P type semiconductor layer 12 is further formed. A cathode electrode 15 is formed on the back surface of the semiconductor substrate 10.

A mesa groove 16 is formed from the front surface of the P type semiconductor layer 12 to the N+ type semiconductor substrate 10. The mesa groove 16 is formed deeper than the N− type semiconductor layer 11, of which the bottom is located in the N+ type semiconductor substrate 10. A second insulation film 37 fills the mesa groove 16 so as to cover the sidewall thereof including the PN junction JC of the N− type semiconductor layer 11 and the P type semiconductor layer 12 which are in contact. The mesa diode is surrounded by this mesa groove 16, forming a mesa structure. The scribe line DL1 of this mesa diode extends along the center of the width of the mesa groove 16.

Furthermore, as other conventional art, in the case where the scribe line DL2 of the mesa diode surrounded by the mesa groove 26 extends surrounding the mesa groove 26 on its outside as shown in FIGS. 14 and 15, a first insulation film 23 is formed on the P type semiconductor layer 12 and a mesa groove 26 is formed in an opening of the first insulation film 23 deeper than the N− type semiconductor layer 11. A second insulation film 47 fills the mesa groove 26 so as to cover the sidewall including the PN junction JC. A mesa semiconductor device is described in Japanese Patent Application Publication No. 2003-347306.

In the conventional arts of FIGS. 12 and 13 described above, however, when the second insulation film 37 is cut along the scribe line DL1 with a dicing blade in dicing, regions 37C of the second insulation film 37 near the front surface of the P type semiconductor layer 12 separate to cause a formation defect of the second insulation film 37. Furthermore, in the conventional arts of FIGS. 14 and 15, when the P type semiconductor layer 12 is cut along the scribe line DL2 on the outside of the mesa groove 26 with a dicing blade, regions 12C of the P type semiconductor layer 12 near its front surface chip or crack. It means that both the conventional arts have a problem of reducing the yield and productivity of the mesa semiconductor device.

SUMMARY OF THE INVENTION

The invention provides a method of manufacturing a mesa semiconductor device. The method includes providing a semiconductor substrate including a first semiconductor layer of a first general conductive type and a second semiconductor layer of a second general conductive type formed on the front surface of the first semiconductor layer so as to have a PN junction between the first and second semiconductor layers, forming a first insulation film on the front surface of the second semiconductor layer so as to have an opening to expose the front surface of the second semiconductor layer, forming a mesa groove in the semiconductor substrate by etching the exposed front surface of the second semiconductor layer to define a mesa structure, forming a second insulation film so as to fill the mesa groove at least partially and to extend beyond a lateral edge of the mesa groove to cover part of the front surface of the second semiconductor layer, and performing dicing along the mesa groove so that the width of removal of the semiconductor substrate by dicing is narrower than the width of the mesa groove.

The invention provides another method of manufacturing a mesa semiconductor device. The method includes providing a semiconductor substrate including a first semiconductor layer of a first general conductive type and a second semiconductor layer of a second general conductive type formed on the front surface of the first semiconductor layer so as to have a PN junction between the first and second semiconductor layers, forming a first insulation film on the front surface of the second semiconductor layer so as to have a first opening to expose a first portion of the front surface of the second semiconductor layer and so as to have a second opening to expose a second portion of the front surface of the second semiconductor layer, forming a mesa groove in the semiconductor substrate by etching the exposed first portion of the front surface of the second semiconductor layer so as to define a mesa structure, forming a scribe groove in the semiconductor substrate by etching the exposed second portion of the front surface of the second semiconductor layer so as to surround the mesa groove, forming a second insulation film covering the mesa groove and the scribe groove, and performing dicing along the scribe groove covered by the second insulation film so that the width of removal of the semiconductor substrate by dicing is narrower than the width of the scribe groove.

The invention also provides a mesa semiconductor device that includes a semiconductor substrate including a first semiconductor layer of a first general conductive type and a second semiconductor layer of a second general conductive type formed on the front surface of the first semiconductor layer so as to have a PN junction between the first and second semiconductor layers, a first insulation film disposed the front surface of the second semiconductor layer, a step portion formed in a sidewall of the semiconductor substrate so as to have a dent penetrating into the second semiconductor layer and part of the first semiconductor layer, and a second insulation film filling the dent at least partially and extending to cover part of the front surface of the second semiconductor layer.

The invention provides another mesa semiconductor device that includes a semiconductor substrate including a first semiconductor layer of a first general conductive type and a second semiconductor layer of a second general conductive type formed on the front surface of the first semiconductor layer so as to have a PN junction between the first and second semiconductor layers, a first insulation film disposed the front surface of the second semiconductor layer, a mesa groove formed in the semiconductor substrate from the front surface of the second semiconductor layer to define a mesa structure, a step portion formed in a sidewall of the second semiconductor layer so as to have a dent penetrating into the second semiconductor layer, and a second insulation film covering the dent portion and the mesa groove.

DETAILED DESCRIPTION OF THE INVENTION

A mesa semiconductor device of a first embodiment of this invention and a method of manufacturing that device will be described using a mesa diode as example. FIGS. 1 to 6 are cross-sectional views showing the mesa diode and the method of manufacturing the device and correspond to a cross-section of FIG. 12 along line X-X. In FIGS. 1 to 6, the same reference numerals are given to the same components as those shown in FIG. 12.

The method of manufacturing the mesa diode described below is conducted to a semiconductor wafer where a plurality of mesa diodes is to be disposed in a matrix as shown in FIG. 12. In FIGS. 1 to 6, for convenience of the description, one of plural mesa diodes is mainly shown and two mesa diodes adjacent to this are partially shown.

Figure 1:
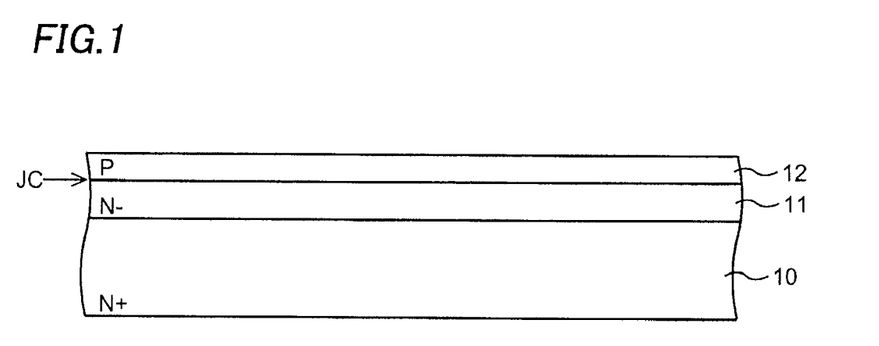
FIGS. 1 to 6 are cross-sectional views showing a mesa diode and a method of manufacturing the same of a first embodiment of the invention.

As shown in FIG. 1, an N+ type semiconductor substrate 10 (e.g. a silicon single crystal substrate) where a high concentration of N type impurity such as, for example, phosphorus is diffused is provided. A low concentration N type semiconductor layer, i.e., an N– type semiconductor layer 11 is formed on the front surface of the semiconductor substrate 10 by, for example, epitaxially growing a semiconductor layer. Instead of this, the N– type semiconductor layer 11 may be an impurity diffused region formed by diffusing an impurity in the front surface of the semiconductor substrate 10. Then, a P type semiconductor layer 12 is formed on the front surface of the N– type semiconductor layer 11 by, for example, diffusing a P type impurity such as boron. By this process, a PN junction JC is formed at the interface of the N– type semiconductor layer 11 and the P type semiconductor layer 12. In the structure described above, the total thickness of the semiconductor substrate 10, the N– type semiconductor layer 11 and the P type semiconductor layer 12 is about 200 μm, for example.

It is noted that conductivity types such as N+, N and N– belong in one general conductivity type, and conductivity types such as P+, P and P– belong in another general conductivity type.

Figure 2:
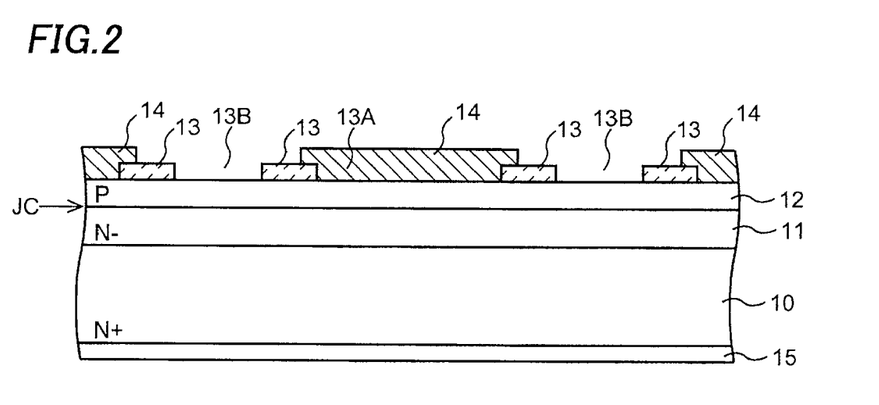

Then, as shown in FIG. 2, a first insulation film 13 such as a silicon oxide film is formed on the front surface of the P type semiconductor layer 12 by, for example, a thermal oxidation method or a CVD method. The first insulation film 13 is then partially etched using a mask to provide the first insulation film 13 with a first opening 13A and a second opening 13B exposing the P type semiconductor layer 12 partially. The first opening 13A corresponds to an active region of the mesa diode, and the second opening 13B corresponds to a region for forming a mesa groove 16 which will be described below. The center or almost the center portion of the width of the region for forming the mesa groove 16 corresponds to a scribe line region along a scribe line DL1.

Then, an anode electrode 14 connected to the P type semiconductor layer 12 through the first opening 13A of the first insulation film 13 is formed. The anode electrode 14 is made of a conductive material such as aluminum and formed by a sputtering method, a vapor deposition method or the like. A cathode electrode 15 made of a conductive material such as aluminum is formed on the back surface of the semiconductor substrate 10 by the same method as the method of forming the anode electrode 14.

Figure 3:
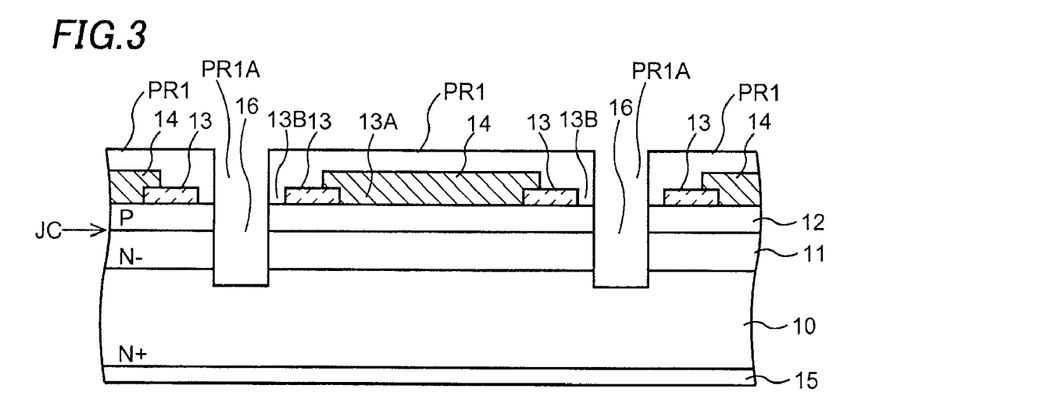

Then, as shown in FIG. 3, a resist layer PR1 covering the first insulation film 13 is formed. The resist layer PR1 has an opening PR1A in the region for forming the mesa groove 16 corresponding to the second opening 13B of the first insulation film 13. Then, the P type semiconductor layer 12, the N– type semiconductor layer 11, and the semiconductor substrate 10 are etched in a region reaching the middle of the semiconductor substrate 10 in the thickness direction using this resist layer PR1 as a mask to form the mesa groove 16 surrounding the active region of the mesa diode. In this etching, the mesa groove 16 having a high aspect ratio is obtained by using the Bosch process in which isotropic dry-etching and formation of a protection film are repeated, anisotropic dry-etching under extremely low pressure, or the like. The bottom of the mesa groove 16 is located deeper than the N– type semiconductor layer 11 and reaches the inside of the semiconductor substrate 10. The total depth is preferably about 100 μm. In other words, the mesa groove 16 reaches about half the depth of the stack of the semiconductor substrate 10 and the semiconductor layers 11 and 12. The width of the mesa groove 16 is about 10 μm, for example.

The mesa diode having such a mesa groove 16 has a high breakdown voltage when a reverse bias is applied, i.e., when a high voltage is applied from the cathode electrode 15 to the anode electrode 14 and a reverse bias is applied to the PN junction JC.

Figure 4:
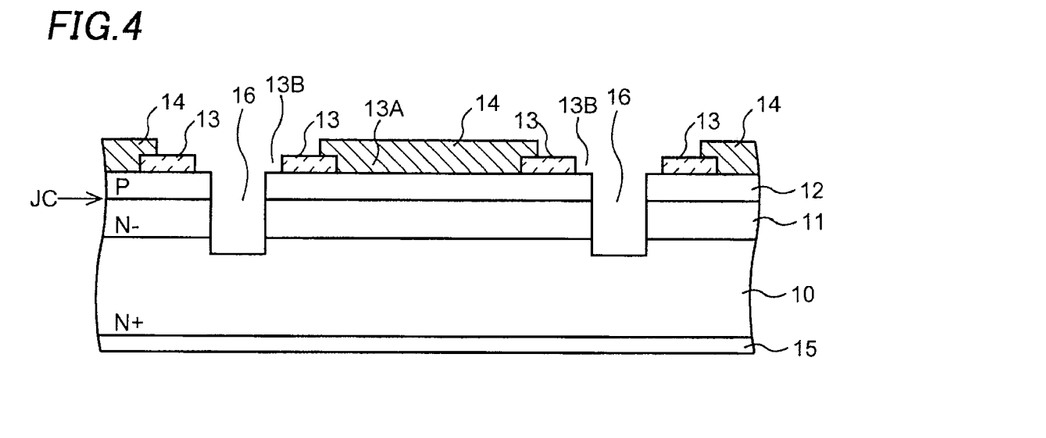
Figure 5:
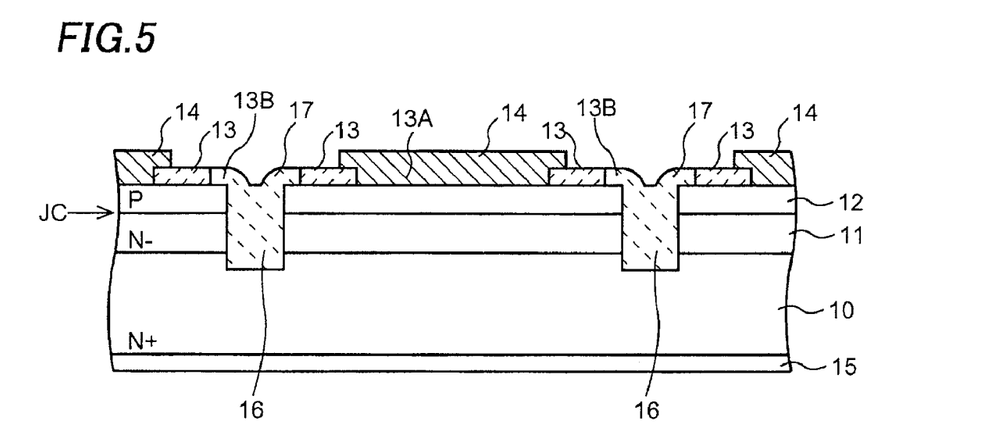

Then, the resist layer PR1 is removed as shown in FIG. 4, and then as shown in FIG. 5, a second insulation film 17 is formed so as to fill the mesa groove 16 and continuously extend from inside the mesa groove 16 onto the front surface of the P type semiconductor layer 12 on the outside of the mesa groove 16. A part of the second insulation film 17 extending on the outside of the mesa groove 16 is preferably at least about 10 μm from the end of the mesa groove 16. The second insulation film 17 may cover the first insulation film 13 surrounding the mesa groove 16 as well as the P type semiconductor layer 12 on the outside of the mesa groove 16, or may further cover the end portion of the anode electrode 14.

The second insulation film 17 is made of an organic insulator having, during its application to the substrate 10, a viscosity such that it extends continuously from inside the mesa groove 16 onto the front surface of the P type semiconductor layer 12 on the outside of the mesa groove 16. For example, a viscosity of 100 to 150 Pa·s during the application is good enough to achieve an appropriate coverage. After this application, the second insulation film 17 is cured, i.e., becomes more rigid. The second insulation film 17 contains polyimide type resin or epoxy type resin, for example. Alternatively, instead of the organic insulator described above, glass paste made by mixing lead or zinc type glass powder and resin may be used as the second insulation film 17 as long as it has the same viscosity as described above. The second insulation film 17 is formed by a screen printing method, a dispensing method or a spin coating method, for example, and patterned by a photolithography process or the like according to needs.

Figure 6:
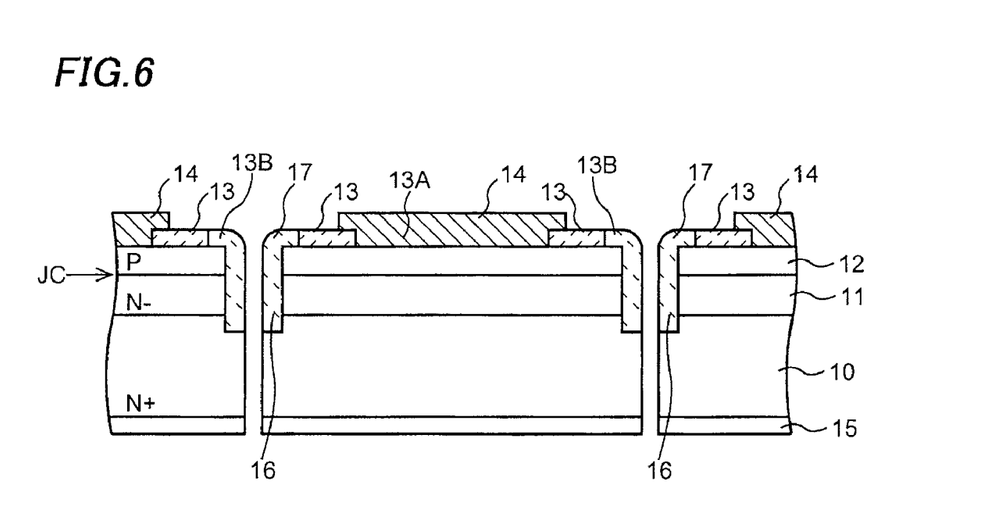

Then, as shown in FIG. 6, the lamination body made of the semiconductor substrate 10 and the layers laminated thereon is diced along the scribe line DL1 extending on almost the center portion of the bottom of the mesa groove 16 by cutting a narrower region than the width of the mesa groove 16 with a dicing blade. As a result, step-like structures are formed at both ends of the stack of the semiconductor substrate 10 and semiconductor layers 11 and 12. The second insulation film 17 improves the mechanical strength of the top corner portion of the semiconductor device over the conventional device since it is formed so as to fill the mesa groove 16 and continuously extend from inside the mesa groove 16 onto the front surface of the P type semiconductor layer 12 on the outside of the mesa groove 16 as described above. Therefore, when the second insulation film 17 is cut along the scribe line DL1 with the dicing blade, the second insulation film 17 near the front surface of the P type semiconductor layer 12 is prevented from separating. As a result, the yield and productivity of the mesa diode are enhanced.

Furthermore, since the second insulation film 17 fills the mesa groove 16 deeper than the N− type semiconductor layer 11, reaching the inside of the semiconductor substrate 10, it functions as a guard ring for preventing water entering the active region of the mesa diode.

Furthermore, the lamination body made of the semiconductor substrate 10 and the layers laminated thereon is separated into individual mesa diodes along the mesa groove 16 as a boundary. It means that the sidewall of the mesa diode is the ends of the N− type semiconductor layer 11 and the P type semiconductor layer 12. Therefore, the die size is equal to the active region of the mesa diode, and thus miniaturization of the mesa diode is realized.

Hereafter, a mesa semiconductor device of a second embodiment of this invention and a method of manufacturing that device will be described using another mesa diode as an example. FIGS. 7 to 11 are cross-sectional views showing the mesa diode of the second embodiment and the method of manufacturing the device, and correspond to a cross-section of FIG. 14 along line Y-Y. In FIGS. 7 to 11, the same reference numerals are given to the same components as those shown in FIGS. 1 to 6 and FIG. 14.

The method of manufacturing the mesa diode described below is conducted to a semiconductor wafer where a plurality of mesa diodes is to be disposed in a matrix as shown in FIG. 14. In FIGS. 7 to 11, for convenience of the description, one of plural mesa diodes is mainly shown and two mesa diodes adjacent to this are partially shown.

Figure 7:
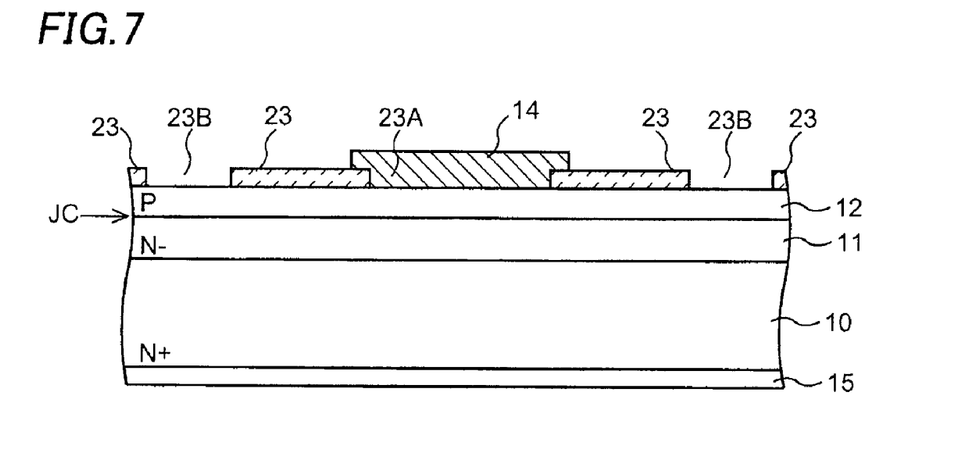
FIGS. 7 to 11 are cross-sectional views showing a mesa diode and a method of manufacturing the same of a second embodiment of the invention.

As shown in FIG. 7, in the same manner as in the first embodiment, an N+ type semiconductor substrate 10 is provided, and an N− type semiconductor layer 11 and a P type semiconductor layer 12 are formed on the front surface of this semiconductor substrate 10. A first insulation film 23 such as a silicon oxide film is formed on the front surface of the P type semiconductor layer 12 by, for example, a thermal oxidation method or a CVD method. The first insulation film 23 is then partially etched using a mask to provide the first insulation film 23 with a first opening 23A and a second opening 23B exposing the P type semiconductor layer 12 partially. The first opening 23A corresponds to the active region of the mesa diode, and the second opening 23B corresponds to a scribe line region along a scribe line DL2 surrounding a region for forming a mesa groove 26A.

Then, an anode electrode 14 connected to the P type semiconductor layer 12 through the first opening 23A of the first insulation film 23 is formed. A cathode electrode 15 is formed on the back surface of the semiconductor substrate 10. The material and formation method of the anode electrode 14 and the cathode electrode 15 are the same as in the first embodiment.

Figure 8:
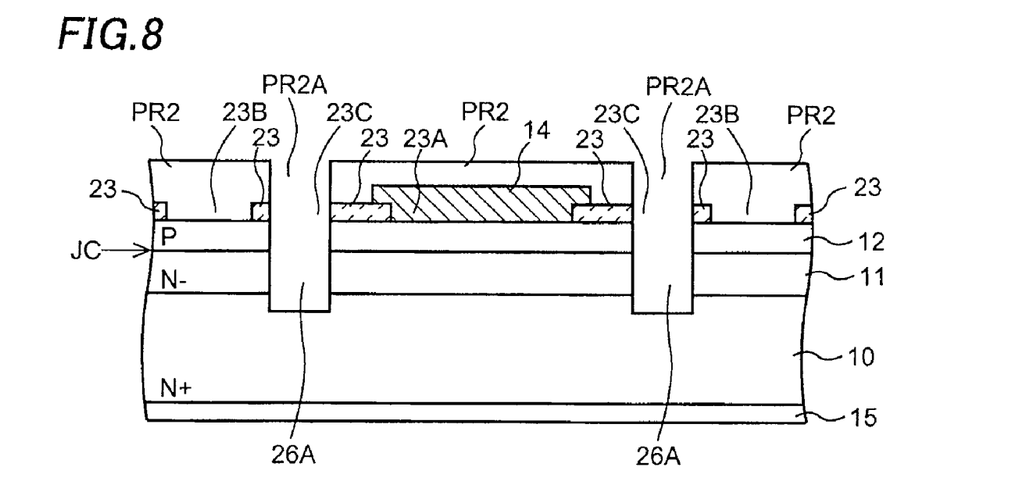

Then, as shown in FIG. 8, a resist layer PR2 covering the first insulation film 23 is formed. The resist layer PR2 has an opening PR2A corresponding to the region for forming the mesa groove 26A which will be described below. The second opening 23B of the first insulation film 23 is covered by the resist layer PR2. The width of the opening PR2A of the resist layer PR2 is smaller than the width of the second opening 23B of the first insulation film 23. Then, the first insulation film 23 exposed in the opening PR2A is etched and removed using this resist layer PR2 as a mask to provide the first insulation film 23 with a third opening 23C. Then, the P type semiconductor layer 12, the N− type semiconductor layer 11 and the semiconductor substrate 10 are removed in a region reaching the middle of the semiconductor substrate 10 in the thickness direction by dry-etching using the resist layer PR2 as a mask, thereby forming the mesa groove 26A surrounding the active region of the mesa diode. The bottom of the mesa groove 26A is located deeper than the N− type semiconductor layer 11 and reaches the inside of the semiconductor substrate 10. The total depth is preferably about 100 μm. The width of the mesa groove 26A is about 10 μm, for example.

Figure 9:
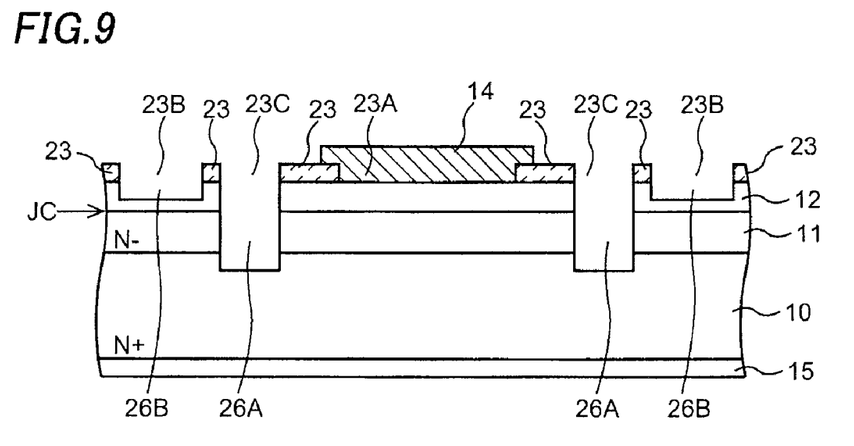

Then, as shown in FIG. 9, after the resist layer PR2 is removed, wet-etching is performed to the inner sidewall of the mesa groove 26A to remove residues on the inner sidewall of the mesa groove 26A produced by the dry-etching described above. This wet-etching cleans the inner sidewall of the mesa groove 26A and also removes the P type semiconductor layer 12 exposed in the second opening 23B of the first insulation film 23 to predetermined depth. By this process, a scribe groove 26B is formed reaching the middle of the P type semiconductor layer 12 in the thickness direction in the scribe line region along the scribe line DL2 extending in the second opening 23B. The scribe groove 26B is formed shallower than the mesa groove 26A, and the depth is preferably about 1 to 3 μm. The width of the scribe groove 26B is about 50 to 100 μm, for example.

Figure 10:
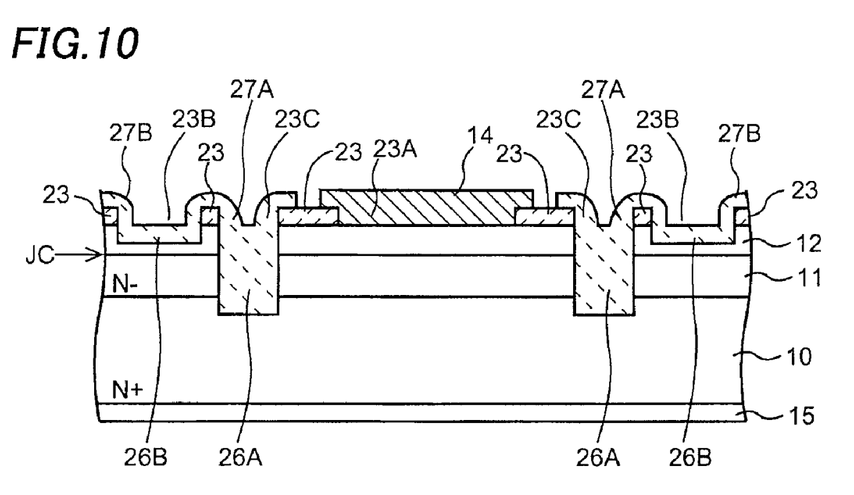

Then, as shown in FIG. 10, second insulation films 27A, 27B are formed so as to fill the mesa groove 26A and the scribe groove 26B and continuously extend from inside the scribe groove 26B to the outside thereof, i.e., onto the first insulation film 23. Although the second insulation film 27A filling the mesa groove 26A is formed being connected to the second insulation film 27B filling the scribe groove 26B in the figure, the films may be formed separately instead. In both the cases, a part of the second insulation film 27B extending on the outside of the scribe groove 26B is about 50 μm from the end of the scribe groove 26B, for example. The second insulation films 27A, 27B are made of the same material and formed by the same method as those for the second insulation film 17 of the first embodiment. Although the second insulation film 27A filling the mesa groove 26A is formed so as not to extend onto the end portion of the anode electrode 14 in the figure, it may extend onto the end portion of the anode electrode 14 instead.

Figure 11:
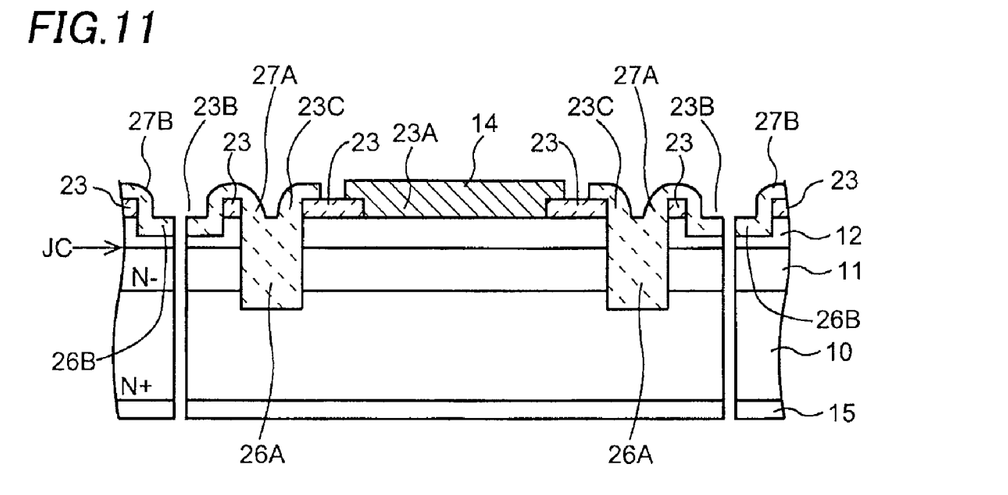

Then, as shown in FIG. 11, the lamination layer made of the semiconductor substrate 10 and the layers laminated thereon is diced along the scribe line DL2 extending in the second opening 23B by cutting a narrower region than the width of the second opening 23B with a dicing blade, and separated into a plurality of mesa diodes. As a result, step-like structures are formed at both ends of the semiconductor layer 12.

The second insulation film 27B improvise the mechanical strength at the top corner portion since it fills the scribe groove 26B and is continuously formed on the outside of the scribe groove 26B, i.e., onto the first insulation film 23 as described above. Therefore, when the second insulation film 26B is cut along the scribe line DL2 with the dicing blade, the second insulation film 26B near the front surface of the P type semiconductor layer 12 is prevented from separating. As a result, the yield and productivity of the mesa diode are enhanced.

Furthermore, the second insulation film 27A functions as a guard ring for preventing wafer entering the active region of the mesa diode since it fills the mesa groove 26A reaching the inside of the semiconductor substrate 10 deeper than the N− type semiconductor layer 11.

The invention is not limited to the embodiments described above and modifications are possible within the scope of the invention. For example, in the above embodiments, the first insulation films 13 and 23 are not necessarily formed in the region on the outside of the mesa grooves 16 and 26A. In this case, in the region on the outside of the mesa grooves 16 and 26A, the second insulation films 17 and 27B are formed on the front surface of the P type semiconductor layer 12.

Furthermore, the N+ type semiconductor substrate 10, the N− type semiconductor layer 11 and the P type semiconductor layer 12 in the embodiments described above may be of opposite conductive types, respectively. Furthermore, the P type semiconductor layer may be formed directly on the N type semiconductor substrate. Furthermore, although the description is given using the mesa diode as an example in the embodiments described above, the invention may be applied to other mesa semiconductor devices. For example, the invention may also be applied to a mesa bipolar transistor, a mesa MOSFET, a mesa IGBT, a mesa thyristor or the like. In the case of the mesa bipolar transistor, for example, an NPN type bipolar transistor structure is obtained by further providing an N type semiconductor layer on the front surface of the P type semiconductor layer 12.

With these structures, since the second insulation film having high coverage is formed in a portion which a dicing blade is to contact in dicing, the second insulation film is prevented from separating and the second semiconductor layer is prevented from chipping or cracking as have been in the conventional art.

What is claimed is:

1. A mesa semiconductor device comprising:
   a semiconductor substrate comprising a first semiconductor layer of a first general conductive type and a second semiconductor layer of a second general conductive type formed on a front surface of the first semiconductor layer so as to have a PN junction between the first and second semiconductor layers;
   a first insulation film disposed on a front surface of the second semiconductor layer;
   a step portion formed in a sidewall of the semiconductor substrate so as to have a dent penetrating into the second semiconductor layer and at least part of the first semiconductor layer; and
   a second insulation film filling the dent at least partially and extending to cover part of the front surface of the second semiconductor layer so that the second insulation film is exposed as part of an edge of an operative semiconductor device, the second insulation film being directly in contact with the front surface of the second semiconductor layer, the second insulation film comprising an organic insulator.

2. The mesa semiconductor device of claim 1, wherein the organic insulator comprises a polyimide or an epoxy resin.

3. The mesa semiconductor device of claim 1, wherein the step portion extends beyond the PN junction to reach the first semiconductor layer.

4. The mesa semiconductor device of claim 1, wherein the first semiconductor layer comprises a first layer and a second layer formed on a front surface of the first layer and having a lower impurity concentration than the first layer, and the second layer is in contact with the second semiconductor layer.

5. The mesa semiconductor device of claim 4, wherein the step portion extends beyond the PN junction to reach the first layer of the first semiconductor layer.

6. A mesa semiconductor device comprising:
   a semiconductor substrate comprising a first semiconductor layer of a first general conductive type and a second semiconductor layer of a second general conductive type formed on a front surface of the first semiconductor layer so as to have a PN junction between the first and second semiconductor layers;
   a first insulation film disposed on a front surface of the second semiconductor layer;
   a mesa groove formed in the semiconductor substrate from the front surface of the second semiconductor layer so as to surround a mesa structure so that, in a sectional view cut perpendicular to the front surface of the first semiconductor layer, the mesa structure is placed between two different portions of the mesa groove;
   a step portion formed in a sidewall of the second semiconductor layer so as to have a dent penetrating into the second semiconductor layer; and
   a second insulation film covering the dent portion and the mesa groove so that the second insulation film is exposed as part of an edge of an operative semiconductor device.

7. The mesa semiconductor device of claim 6, wherein the second insulation film comprises an organic insulator.

8. The mesa semiconductor device of claim 7, wherein the organic insulator comprises a polyimide or an epoxy resin.

9. The mesa semiconductor device of claim 6, wherein the mesa groove extends beyond the PN junction to reach the first semiconductor layer.

10. The mesa semiconductor device of claim 6, wherein the first semiconductor layer comprises a first layer and a second layer formed on a front surface of the first layer and having a lower impurity concentration than the first layer, and the second layer is in contact with the second semiconductor layer.

11. The mesa semiconductor device of claim 10, wherein the mesa groove extends beyond the PN junction to reach the first layer of the first semiconductor layer.

* * * * *